(12) United States Patent
Beynet et al.

(10) Patent No.: US 9,023,737 B2
(45) Date of Patent: May 5, 2015

(54) METHOD FOR FORMING CONFORMAL, HOMOGENEOUS DIELECTRIC FILM BY CYCLIC DEPOSITION AND HEAT TREATMENT

(71) Applicant: ASM IP Holding B.V., Almere (NL)

(72) Inventors: Julien Beynet, Kawasaki (JP); Ivo Raaijmakers, Bilthoven (NL); Atsuki Fukazawa, Tama (JP)

(73) Assignee: ASM IP Holding B.V., Almere (NL)

( * ) Notice: Subject to any disclaimer, the term of this patent is extended or adjusted under 35 U.S.C. 154(b) by 209 days.

(21) Appl. No.: 13/923,197

(22) Filed: Jun. 20, 2013

(65) Prior Publication Data

US 2014/0017908 A1 Jan. 16, 2014

Related U.S. Application Data

(60) Provisional application No. 61/670,496, filed on Jul. 11, 2012.

(51) Int. Cl.
| | | |
|---|---|---|
| H01L 21/31 | (2006.01) | |
| H01L 21/469 | (2006.01) | |
| H01L 21/02 | (2006.01) | |
| C23C 16/34 | (2006.01) | |
| C23C 16/455 | (2006.01) | |
| C23C 16/56 | (2006.01) | |

(52) U.S. Cl.
CPC .... *H01L 21/02318* (2013.01); *H01L 21/02164* (2013.01); *H01L 21/0217* (2013.01); *H01L 21/02211* (2013.01); *H01L 21/02219* (2013.01); *H01L 21/02274* (2013.01); *H01L 21/0228* (2013.01); *H01L 21/02348* (2013.01); *C23C 16/345* (2013.01); *C23C 16/45536* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 7,919,416 B2 | 4/2011 | Lee | |
| 7,972,980 B2 | 7/2011 | Lee | |
| 2008/0026597 A1* | 1/2008 | Munro et al. | 438/788 |
| 2008/0179715 A1* | 7/2008 | Coppa | 257/647 |
| 2008/0220619 A1 | 9/2008 | Matsushita | |
| 2009/0061647 A1* | 3/2009 | Mallick et al. | 438/773 |
| 2009/0142935 A1 | 6/2009 | Fukazawa | |
| 2012/0214318 A1 | 8/2012 | Fukazawa | |
| 2012/0295449 A1 | 11/2012 | Fukazawa | |

* cited by examiner

*Primary Examiner* — Davienne Monbleau
*Assistant Examiner* — Shaka White
(74) *Attorney, Agent, or Firm* — Snell & Wilmer LLP

(57) ABSTRACT

A method for forming a conformal, homogeneous dielectric film includes: forming a conformal dielectric film in trenches and/or holes of a substrate by cyclic deposition using a gas containing a silicon and a carbon, nitrogen, halogen, hydrogen, and/or oxygen, in the absence of a porogen gas; and heat-treating the conformal dielectric film and continuing the heat-treatment beyond a point where substantially all unwanted carbons are removed from the film and further continuing the heat-treatment to render substantially homogeneous film properties of a portion of the film deposited on side walls of the trenches and/or holes and a portion of the film deposited on top and bottom surfaces of the trenches and/or holes.

14 Claims, 4 Drawing Sheets

METHOD FOR FORMING CONFORMAL, HOMOGENEOUS DIELECTRIC FILM BY CYCLIC DEPOSITION AND HEAT TREATMENT

CROSS-REFERENCE TO RELATED APPLICATIONS

This application claims priority to U.S. Provisional Patent Application No. 61/670,496, entitled "Method for Forming Conformal, Homogeneous Dielectric Film by Cyclic Deposition and Heat Treatment," and filed on Jul. 11, 2012, all of which is incorporated herein by reference.

BACKGROUND OF THE INVENTION

1. Field of the Invention

The present invention generally relates to semiconductor integrated circuit manufacturing and, more particularly to a method of forming a conformal, homogeneous dielectric film such as a silicon nitride film by cyclic deposition, such as atomic layer deposition, and heat treatment.

2. Description of the Related Art

Integrated circuits fabricated on semiconductor substrates for large scale integration require multiple levels of metal interconnections to electrically interconnect discrete layers of semiconductor devices formed on semiconductor chips. The different levels of interconnections are separated by various insulating or dielectric layers, which are etched to form via holes so as to connect one level of metal to another.

The evolution of chip design continually requires faster circuitry and greater circuit density than before. For faster circuits with greater circuit densities, certain properties are required of materials used to fabricate such integrated circuits, particularly as the dimensions of integrated circuit components are reduced to the sub-micron scale. Also, for greater integrated circuit densities, certain process sequences are required for the manufacture of integrated circuit components.

In recent years, silicon nitride layers deposited at low temperatures (less than 400° C.) have been used in a number of important applications for memory devices, for example, as a passivation layer, a surface protection layer and/or a spacer for a transistor gate. Silicon nitride films may be formed by a plasma enhanced chemical vapor deposition (PECVD) method. The main advantages of the PECVD method over other CVD methods are higher deposition rates, and controllability over a wide range of refractive indices. A further advantage of the PECVD method is that the process can take place at a relatively low temperature, for example temperatures under 400° C., keeping the total thermal budget of the cell processing to a minimum. Furthermore, the PECVD method provides good material properties to films.

However, the PECVD method for forming silicon nitride leads to poor conformality or poor step coverage on a substrate containing small and/or high aspect ratio features. In small circuits and devices, such as ultra-large scale integrated (ULSI) circuitry, poor conformal coverage can hamper the development of higher density circuit devices and elements.

For high conformality of films, cyclic deposition methods such as cyclic CVD, plasma-enhanced atomic layer deposition (PEALD), and thermal ALD are suitable. However, since ALD is a self-limiting adsorption reaction process, the amount of deposited precursor molecules is determined by the number of reactive surface sites and is independent of the precursor exposure after saturation, and a supply of the precursor is such that the reactive surface sites are saturated thereby per cycle. In ALD, reaction occurs on surfaces and forms films thereon, and thus ALD achieves high conformality of films in trenches and holes formed in a substrate. Similarly, since cyclic CVD typically provides gases alternately in cycles to deposit films, it also can improve conformality of films.

However, the present inventors have discovered that although cyclic deposition methods improve conformality of films, the film qualities such as wet etch rate are poor along sidewalls of trenches and holes relative to those of top/bottom surfaces of trenches and holes, especially when the trenches and holes are small (e.g., about 10 nm to about 50 nm in width) and/or have a high aspect ratio (e.g., about 5 to about 20). The present inventors believe that that is because when trenches and holes are small and/or have a high aspect ratio, deposition reactions do not sufficiently progress on sidewalls even if high conformality of films is achieved, and as a result, impurities remain inside the films as residues of reaction gases and/or byproducts of reaction.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

Some embodiments provide a method for forming a conformal, homogeneous dielectric film having at least Si—N or Si—O bonds by cyclic deposition, comprising:
  forming a conformal dielectric film in trenches and/or holes of a substrate by cyclic deposition using a gas containing a silicon and a carbon, nitrogen, halogen, hydrogen, and/or oxygen, in the absence of a porogen gas; and
  heat-treating the conformal dielectric film and continuing the heat-treatment beyond a point where substantially all unwanted carbons are removed from the film and further continuing the heat-treatment to render substantially homogeneous film properties of a portion of the film deposited on side walls of the trenches and/or holes and a portion of the film deposited on top or bottom surfaces of the trenches and/or holes.

The post-deposition heat treatment is conducted for rendering the film homogeneous along the surfaces, i.e., the film properties on the sidewalls and those on the top/bottom surfaces are substantially homogeneous, even when trenches and holes are small (e.g., about 10 nm to about 50 nm in width) and/or have a high aspect ratio (e.g., about 5 to about 10). The post-deposition heat treatment is not for removing a porogen gas from films to improve mechanical strength of the films as a whole. In order to remove impurities, such as unwanted halogen, hydrogen, and water molecules originating in reaction gases and/or formed by deposition reaction, remaining in the films locally on the sidewalls, the heat treatment continues beyond a point where substantially all unwanted carbons are removed from the films.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
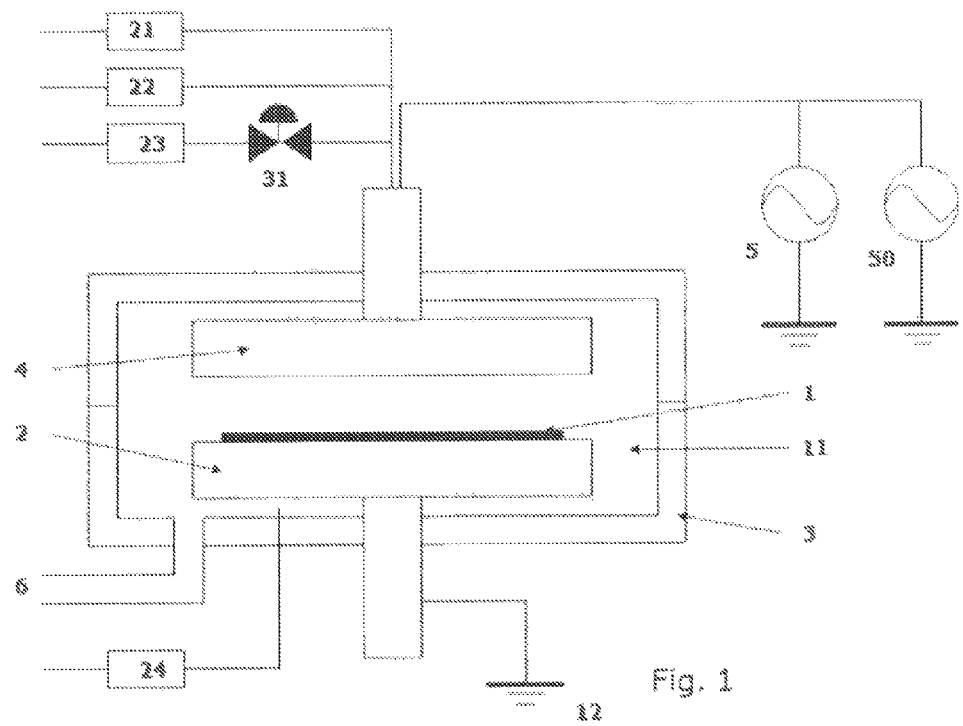
FIG. 1 is a schematic representation of a PEALD apparatus for depositing a dielectric film usable in some embodiments of the present invention.

In this disclosure, "gas" may include vaporized solid and/or liquid and may be constituted by a single gas or a mixture of gases. In this disclosure, the reactive gas, the additive gas, and the hydrogen-containing silicon precursor may be different from each other or mutually exclusive in terms of gas types, i.e., there is no overlap of gas types among these categories. Gases can be supplied in sequence with or without overlap. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, "a" refers to a species or a genus including multiple species. Further, in this disclosure, any two numbers of a variable can constitute a workable range of the variable as the workable range can be determined based on routine work, and any ranges indicated may include or exclude the endpoints. Additionally, any values of variables indicated may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

As described above, some embodiments include a method for forming a conformal, homogeneous dielectric film having at least Si—N or Si—O bonds by cyclic deposition, comprising: (i) forming a conformal dielectric film in trenches and/or holes of a substrate by cyclic deposition using a gas containing a silicon and a carbon, nitrogen, halogen, hydrogen, and/or oxygen, in the absence of a porogen gas; and (ii) heat-treating the conformal dielectric film and continuing the heat-treatment beyond a point where substantially all unwanted carbons are removed from the film and further continuing the heat-treatment to render substantially homogeneous film properties of a portion of the film deposited on side walls of the trenches and/or holes and a portion of the film deposited on top and bottom surfaces of the trenches and/or holes.

In this disclosure, "having Si—N bonds" may refer to being characterized by Si—N bonds, being constituted mainly or predominantly by Si—N bonds, being categorized as Si—N films, and/or having a main skeleton substantially constituted by Si—N bonds. Likewise, "having Si—O bonds" may be defined. Also in this disclosure, "substantially all unwanted carbons" may refer to all unwanted carbons as detectable content, unwanted carbons equivalent to all detectable carbons, all unwanted carbons except for an immaterial amount of carbons, all unwanted carbons except for a negligible amount of carbons, or 90% to 99.9% carbons. In some embodiments, after a point where substantially all unwanted carbons are removed, the unwanted carbon content may be less than 2%, 1%, 0.5%, 0.1%, or a less than detectable level. In this disclosure, an "unwanted" element may be referred to also as "impurities" as defined below. Unwanted carbon may originate in a precursor for a film, does not stoichiometrically constitute the film, and remains in the film as deposited. The unwanted carbon can be removed from the film by heat treatment as a volatile component, relatively easily as compared with unwanted halogen, hydrogen, or water molecules. Carbon which stoichiometrically constitutes the film and is a part of the chemical composition of the film, such as carbon of SiCN, is not intended to be removed by the heat treatment, the energy of which is not high enough to cause breakdown of the chemical composition of the film (typically 600° C. or higher is required to dissociate carbon from the chemical composition).

In this disclosure, "substantially homogeneous" may refer to having a substantially constant property, such as wet etch rate, throughout the film along a direction parallel to the surface of a substrate, including a layer formed on the sidewalls and a layer formed on the top/bottom surfaces, where "substantially constant" may refer to an immaterial difference or a difference recognized by a skilled artisan, e.g., in this context of wet etch rate, such as a magnitude of difference of 1/2.5 to 2.5/1, 1/2 to 2/1, 1/1.5 to 1.5/1, or any other equivalent ranges thereof in some embodiments or a difference in wet etch rate of about 5 nm/second or less, about 3 nm/second or less, or about 1 nm/second or less in some embodiments. In this disclosure, a "conformal" film may refer to a film having a ratio of thickness of a portion formed on a sidewall of a trench/hole to thickness of a portion formed on a top/bottom surface (if thickness at a top surface and that at a bottom surface are materially different, thickness at the bottom surface is used) of the trench/hole, which ratio is referred to as conformity and is about 100%±20% or 95%±5%. In some embodiments, the conformity of the film may be changed (increased or decreased) after the heat treatment by about 5 percentage points or less due to shrinkage of the film where the thickness of the film is changed by about 5% to about 10%.

The conformality of film can be determined by means of special substances, where high aspect ratio features are realized. After cyclic deposition, cross-sectional SEM and/or TEM are then used to determine whether conformal coating could be achieved on the entire inner surface of the trenches/holes. The normalized film thickness (with respect to the film thickness outside the hole) may be a function of deposition time, and the conformality may be a function of aspect ratio, pressure, precursor pulse time, etc.

In the step of forming a conformal dielectric film in trenches and/or holes of a substrate by cyclic deposition, a gas containing a silicon and a carbon, nitrogen, halogen, hydrogen, and/or oxygen, is used in the absence of a porogen gas. In some embodiments, the cyclic deposition includes, but is not limited to, cyclic CVD and ALD such as thermal atomic layer deposition (ALD), plasma-enhanced ALD, radical-enhanced ALD, or cyclic plasma-enhanced CVD, or any other cyclic deposition suitable for forming a conformal film. Any cyclic deposition, especially plasma-enhanced cyclic deposition, may cause a non-homogeneous nature of film in trenches/holes since relatively large radicals such as N+, $N_2$+ radicals do not easily enter the trenches/holes and contact the sidewalls thereof, and energy irradiation such as plasma discharge has directivity and the sidewalls of the trenches/holes are not exposed to the energy irradiation, resulting in insufficient deposition reaction on the sidewalls relative to the top and bottom surfaces of the trenches/holes, leaving impurities in the portion. As a result, the portion of the film formed on the sidewalls is likely to have defects in the film structure and suffer wet etch resistance or the like. The higher the conformality of the film, the more the defect may occur in the film structure at the sidewalls.

A skilled artisan can determine conditions for depositing a conformal dielectric film constituted by SiN or SiO in view of this disclosure based on routine work. In some embodiments, a SiN or SiO film is deposited using methods disclosed in U.S. patent application publication No. 2010/0124618 and No. 2010/124621, U.S. Pat. No. 7,919,416, and co-assigned U.S. patent application Ser. No. 13/030,438, each disclosure of which is herein incorporated by reference in its entirety. In some embodiments, the thickness of the film before the heat treatment may be in a range of about 10 nm to about 200 nm, typically about 10 nm to about 30 nm.

In some embodiments, the portion of the film deposited on the side walls contains excess impurities as compared with the portion of the film deposited on the top and bottom surfaces, which impurities do not stoichiometrically constitute the film, wherein the heat-treatment is continued to remove excess impurities from the portion of the film deposited on the side walls. In this disclosure, "impurities" may refer to unwanted, thermally removable elements which contribute to non-homogeneous properties of the film and do not stoichiometrically constitute the film, elements which are not part of the chemical structures representing the film, or elements which are different from the chemical composition constituting the film structure (such as halogen, water molecules, or carbon), or excessive portions of elements (although some of the elements are part of the chemical structures, but excessive portions of the elements constitute impurities; such as excessive hydrogen in a SiNH film, or unwanted carbon in a SiCN film). In some embodiments, the impurities may not easily be detected by a composition analysis due to their significantly low content and highly localized small areas (sidewalls) in the film, and thus include logically existing but undetected elements wherein non-homogeneous properties of the film can reasonably be considered to be indicative of the presence of the elements. The impurities such as unwanted halogen, hydrogen, and water molecules are thermally removable, but typically, the energy to do so is much higher than that required to remove unwanted carbon from the film. In some embodiments, the impurities include, but are not limited to, halogen, hydrogen, and/or water molecules. Halogen may originate in a precursor for forming a Si—N film, such as a chlorine-containing silicon precursor (e.g., $Si_2Cl_6$, dichloroethylsilane, dichlorotetramethyldisilane, dichlorodimethylsilane, tetrachlorodimethyldisilane, bis(dichloromethylsilyl)etane, bisdiethylaminosilane, or tetramethyldisilazane). Hydrogen may also originate in a precursor such as those described above.

In other embodiments, HEAD ($Si_2[NHC_2H_6]_6$), 3DMASCl ($Si[N(CH_3)_2]_3Cl$), 3EMAS ($H_2Si[N(C_2H_5)CH_3]_3$), 4DMAS ($Si[N(C_2H)_2]_4$), 4DEAS ($Si[N(C_2H_6)_2]_4$) and other materials belonging to the aminosilane group can be used as a precursor. Other materials that can be used include $SiH_4$, $Si_2H_6$, TSA ($[SiH_3]_3N$), HCDS ($Si_2Cl_6$), $Si_3H_8$, TICS ($Si[NCO]_4$), TBOS ($Si[OtBu]_3OH$), TDMHyS ($Si[NHMe_2]_4$), among others. One type of precursor may be used alone, or two or more types may be combined together.

In some embodiments, as the reactant gas, N2, H2, O2, NH3, CH3, CO, $C_2H_6$, $CO_2$, $N_2O$, $B_2H_6$, etc., may be used (only one type of reactant gas may be used, or two or more types may be combined together). Depending on the reactant gas(es) used, such films as SiN, SiO, SiON, SiCN, SiC, SiCO, SiCON, SiON, SiBN, SiBO, etc., can be formed.

Other impurities such as water molecules may be a by-product of the reaction between a precursor and an oxidizing gas.

In typical embodiments, the gases used for forming a film include no or substantially no porogen gas. Porogen gas is typically added to a precursor when forming a dielectric film, wherein the porogen material is trapped in the film matrix, and when the film is cured, the porogen material is removed from the film, thereby creating pores in the film. Typically, the porogen gas is a hydrocarbon having a linear or cyclic structure and expressed by the general chemical formula CnHm, wherein n is selected from the group of 4 to 14 while m is selected from the group of 4 to 30. Since no or substantially no porogen gas is used in typical embodiments, a skilled artisan would not perform curing for removing a porogen material from a film; however, surprisingly, by performing certain heat treatment, a layer of the film extending along trenches/holes can become homogeneous.

In some embodiments, before the heat treatment, the conformal dielectric film is non-homogeneous such that the portion of the conformal dielectric film deposited on the sidewall has a wet etch rate more than 2.5 times (in some embodiments, more than 5 times) higher than that of the portion of the conformal dielectric film deposited on the top or bottom surface. In some embodiments, although the conformal dielectric film to be subjected to the heat treatment is non-homogeneous, it possesses desired or targeted film properties in the portion formed on the top and bottom surfaces of the trenches and/or holes. However, the film does not possess desired or targeted film properties in the portion formed on the sidewalls of the trenches and/or holes.

In some embodiments, the conformal dielectric film is heat-treated, and the heat treatment continues beyond a point where substantially all unwanted carbons are removed from the film, and further continuing the heat-treatment renders substantially homogeneous film properties of a portion of the film deposited on side walls of the trenches and/or holes and a portion of the film deposited on top and bottom surfaces of the trenches and/or holes. In some embodiments, the heat-treatment exerts thermal energy on the film, which is equivalent to energy which the film receives when the film is placed at about 400° C. for a time period of about 10 minutes or longer with UV irradiation (e.g., about 10 minutes to about 30 minutes) or for a time period of 60 minutes or longer without UV irradiation (e.g., about 60 minutes to about 120 minutes). In some embodiments, when the film is placed at about 450° C., the duration of the heat-treatment may be about 30 minutes or longer without UV irradiation (e.g., about 30 minutes to about 60 minutes). In some embodiments, the heat treatment is conducted by irradiating the substrate with UV light at a temperature of 400° C. to 600° C. In some embodiments, the heat treatment is performed using a UV lamp having a wavelength selected from a range of 126 to 350 nm, wherein an ambient gas is introduced at a susceptor temperature in a range of 400 to 600° C. In some embodiments, the heat treatment is conducted in a non-oxidizing atmosphere, or in an active ambient gas. In some embodiments, the ambient gas is at least one selected from the group consisting of N2, rare gas (e.g., He, Ar), H2, and hydrogen nitride (NxHy). In some embodiments, the flow rate of the ambient gas is about 100 sccm to about 5000 sccm (typically about 300 sccm to about 2000 sccm). In some embodiments, once the inside of the chamber is filled with the ambient gas, no further flow is required. In some embodiments, the UV lamp power is about 3 to about 10 mW/cm2 (substrate area) (typically about 5 to about 10 mW/cm2), and pressure is about 1 to about 100 Torr (e.g., about 2 to about 30 Torr).

In a first step of the heat treatment, all unwanted carbons, which may have been derived from a precursor and/or reactant gas, are removed from the film, and in a second step, film properties such as wet etch resistance become substantially homogeneous. In some embodiments, the first and second steps of the heat treatment are continuously performed. In this disclosure, "continuously" refers to without breaking a vacuum, without interruption in terms of a timeline, without changing treatment conditions, immediately thereafter, as a next step, or without a discrete physical or chemical boundary between two structures in some embodiments. A skilled artisan can determine the effective duration and temperature of the heat treatment through routine experimentation in view of this disclosure.

In some embodiments, the method further comprises, after the heat treatment, cooling the substrate in a non-oxidizing ambience before discharging the substrate to an atmospheric condition so that oxidation of the film by being exposed to oxygen or moisture included in the atmosphere can be inhibited. After the heat treatment, the cooling can be accomplished by holding a substrate in a load lock chamber for about 2 to about 10 minutes. $$

The present invention will be explained with respect to typical embodiments, which are not intended to limit the present invention.

FIG. 1 is a schematic view of a plasma ALD reactor with flow control valves, which can be used in some embodiments of the present invention.

In this example, by providing a pair of electrically conductive flat-plate electrodes 4, 2 in parallel and facing each other in the interior 11 of a reaction chamber 3, applying HRF power (13.56 MHz or 27 MHz) 5 and LRF power of 5 MHz or less (400 kHz~500 kHz) 50 to one side, and electrically grounding 12 the other side, a plasma is excited between the electrodes. A temperature regulator is provided in a lower stage 2 (the lower electrode), and a temperature of a substrate 1 placed thereon is kept constant at a given temperature. The upper electrode 4 serves as a shower plate as well, and reaction gas and rare gas are introduced into the reaction chamber 3 through a gas flow controller 23, a pulse flow control valve 31, and the shower plate. Additionally, in the reaction chamber 3, an exhaust pipe 6 is provided, through which gas in the interior 11 of the reaction chamber 3 is exhausted. Additionally, the reaction chamber is provided with a seal gas flow controller 24 to introduce seal gas into the interior 11 of the reaction chamber 3 (a separation plate for separating a reaction zone and a transfer zone in the interior of the reaction chamber is omitted from this figure). Cyclic CVD can be performed using the same apparatus as above in some embodiments.

In some embodiments, subsequently, a UV cure process is performed as a heat treatment on a semiconductor substrate taken out from the reactor, using the UV cure apparatus shown in FIG. 2. The UV cure apparatus comprises a process chamber 111, a UV lamp 112, a susceptor 113, an exhaust port 114, and a gas inlet port 115. The UV lamp and a susceptor 113 are disposed parallel, and are heated by heaters embedded in them respectively. The semiconductor substrate 116, which is a workpiece, is placed on the susceptor 113 and is heated and held. Projected from the UV lamp whose wavelength range is selected from 172-250 nm, light is irradiated toward the semiconductor substrate 116. When the semiconductor substrate is irradiated, gases such as He, H2, N2, rare gas (He, Ar), etc. (depending on the type of film) are being introduced through the gas inlet port 115. The susceptor 113 is equipped with a heater and can adjust the temperature of the substrate. By combining heat and UV irradiation, impurities can effectively be removed from the film, especially from the portion thereof formed on the sidewalls of the trenches/holes.

As the UV cure apparatus, the apparatus disclosed in U.S. Patent Application Publication No. 2006/0165904 can be used, the disclosure of which is incorporated herein by reference in its entirety.

Figure 3:
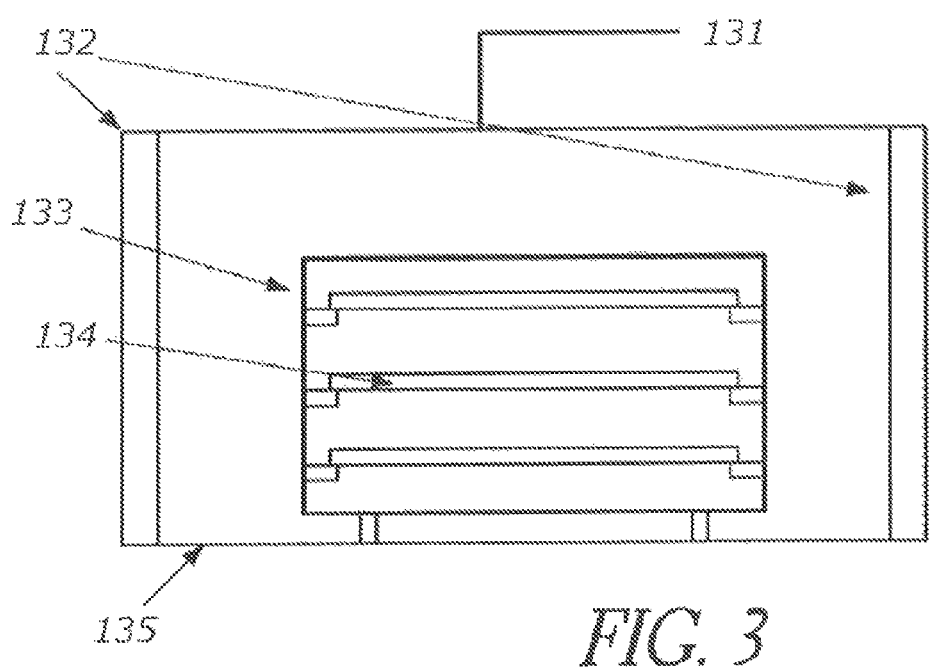
FIG. 3 is a schematic diagram showing a thermal annealing apparatus usable in an embodiment of the present invention.

The heat treatment can also be performed by thermal annealing in place of the JUV curing. FIG. 3 shows a schematic diagram of a thermal annealing apparatus. In a chamber 135, a quartz boat 133 is provided, and a substrate 134 is placed inside the quartz boat 133. The temperature inside the quartz boat 133 is controlled by a heater 132, and gases can be introduced inside through a gas inlet port 131.

In some embodiments, a material such as SiH4 or Si2H6 and a nitrogen additive such as NH3 or N2 are caused to undergo a decomposition reaction by means of plasma on a silicon substrate retained on a susceptor cooled to a temperature of −50 to 50° C. At this time, the film is constituted by only Si, N and H. Thereafter, annealing is performed in a non-oxidizing atmosphere. In consideration of the effect of heat, a method that uses UV curing is selected if the heat treatment temperature is low. If the heat treatment temperature can exceed 450° C., then hot annealing may be used; however, the duration of the thermal annealing may be significantly longer than that of the temperature-controlled UV curing. An appropriate heat treatment temperature may be selected by considering the required heat resistance, etc.

Figure 2:
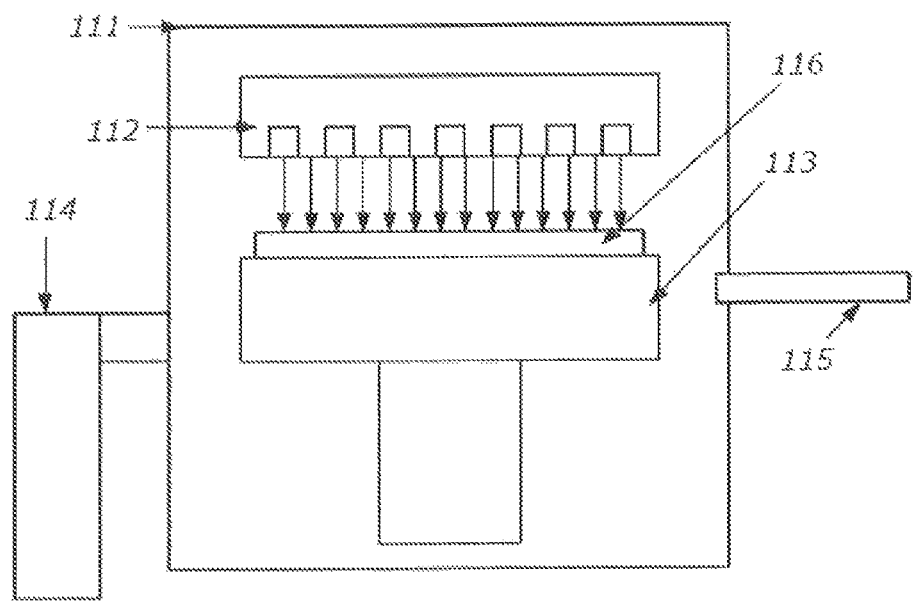
FIG. 2 is a schematic diagram showing a UV curing apparatus usable in an embodiment of the present invention.

Although not illustrated as part of the apparatus shown in FIG. 2, an irradiation window is provided to implement uniform UV irradiation. This irradiation window can be made by synthetic quartz, for example, but any material can be used as long as it can isolate the reactor from atmosphere but transmit UV. Multiple tube-shaped UV emitters are laid in parallel inside the UV irradiation unit, and the layout of these emitters is optimized to achieve uniform irradiation. A reflection plate is provided to allow the UV light from each UV emitter to be reflected properly onto the thin film, where the angle of the reflection plate is made adjustable to achieve uniform irradiation. The UV emitters are structured so that they can be easily removed and replaced. Gas is introduced through a flange, while multiple gas inlet ports are provided in a symmetrical pattern to produce a uniform processing atmosphere.

Figure 4:
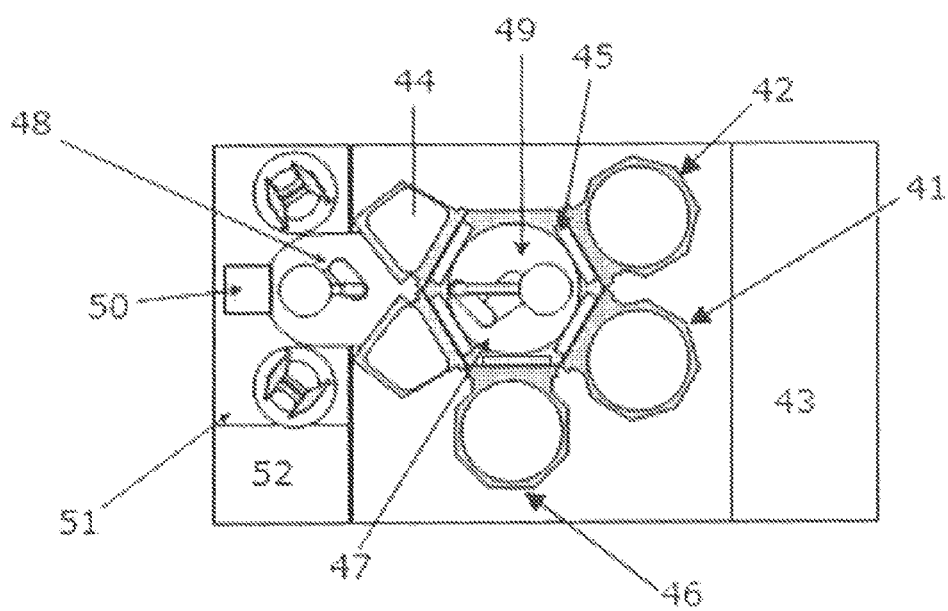
FIG. 4 is a schematic diagram of a cluster type apparatus including a reaction chamber and two UV irradiation chambers usable in an embodiment of the present invention.

FIG. 4 is a schematic diagram showing one example of the apparatus used to implement the UV curing and thermal annealing in some embodiments. This apparatus forms a dielectric film in a reactor chamber 46, after which the substrate is transferred into a UV unit 41 via a gate valve 45 using a robot 49 (vacuum robot) in a vacuum wafer handling chamber 47, to undergo UV processing. Here, a UV lamp may be a high-pressure mercury lamp. In a similar manner, the substrate is transferred into a thermal annealing unit 42 to undergo thermal annealing. The processed substrate is transferred into an I/O load-lock chamber 44 and stored into a cassette port 51 by means of a robot 48 (atmospheric robot). An unprocessed substrate is then carried into the load-lock chamber 44 by the robot 48 from the cassette port 51. Here, the substrate placed on the robot 48 is position-corrected by an orientation flat aligner 50. The gas in the reactor chamber is adjusted by a gas system 43, and the transfer into the load-lock chamber 44, transfer out of the load-lock chamber 44 and other movements are controlled by a control unit in a control cabinet 52. This semiconductor manufacturing apparatus implements the aforementioned series of processing in an automatic sequence, where the processing steps include introduction of gas, UV irradiation, stopping of irradiation, and stopping of gas supply, using a control cabinet 52 and a gas system 43.

The disclosed embodiments will be explained with reference to specific examples which are not intended to limit the present invention. The numerical amounts applied in the specific examples may be modified by a range of at least ±50% in other conditions, wherein the endpoints of the ranges may be included or excluded. In the present disclosure where conditions and/or structures are not specified, the skilled artisan in the art can readily provide such conditions and/or structures, in view of the present disclosure, as a matter of routine experimentation.

EXAMPLES

Film A and film B (SiNH dielectric films) were each formed on a 300-mm substrate having a patterned surface having an aspect ratio of about 2 and an opening width of about 50 nm under the conditions shown below using the PEALD apparatus illustrated in FIG. 1. The thickness of film was 30 nm for evaluating film properties.
Film A by PEALD:
   Precursor: 1,2-dichloro-tetramethyl-disilane
   Precursor inflow pressure: 665 Pa (Vapor Pressure)
   Carrier gas flow: Ar at 2 SLM
   Reactant gas flow (continuous): $NH_3$ at 2 SLM
   Purge gas flow: He at 500 sccm
   Substrate temperature: 400° C.
   RF frequency: 13.56 MHz
   RF power: 400 W
   Precursor supply time: 2 seconds
   Purge time after precursor pulse: 1 second
   RF Plasma exciting time: 3 seconds
   Purge time after RF application: 1 second
   Number of cycles: 500 times
Film B by PE-ALD:
   Precursor: Tetrakis-ethylamino-silane
   Precursor inflow pressure: 300 Pa (Vapor Pressure)
   Carrier gas flow: Ar at 2 SLM
   Substrate temperature: 400° C.
   Reactant gas flow (continuous): $NH_3$ at 2 SLM and $N_2$ at 1 SLM
   RF frequency: 13.56 MHz
   RF power: 500 W
   Precursor supply time: 0.5 seconds
   Purge time after precursor pulse: 1 second
   RF Plasma exciting time: 2 seconds
   Purge time after RF application: 0.3 seconds
   Number of cycles: 400 times The process gases for film A did not include a porogen gas, and according to the composition analysis of film A (blanket), no carbon was detected. Further, the conformality of film A was about 95%. The process gases for film B did not include a porogen gas; however, according to the composition analysis of film B (blanket), no carbon was detected. Further, the conformality of film B was about 94%. However, it was logically expected that portions of film A and film B formed on the sidewalls of the trenches/holes contained unwanted carbon and excess hydrogen (films A and B) and halogen (film A).

Each obtained dielectric film was then subjected to heat treatment. The heat treatment was conducted with or without UV irradiation under the conditions shown below. Heat treatment with UV irradiation was conducted in an apparatus illustrated in FIG. 2 described above using a high-pressure Hg lamp (10 mW/cm$^2$ relative to the area of the substrate, 30 nm). Heat treatment without UV irradiation was conducted in an apparatus illustrated in FIG. 3 described above.
Heat-Treatment
   Pressure: see Table 1
   Substrate temperature: see Table 1
   Ambient gas: see Table 1
   RF frequency: 13.56 MHz
   RF power: 500 W
   Duration: see Table 1

TABLE 1

| Example | Treated Film | Heat Treatment | Tem. (deg-C.) | Ambient Gas | Pressure (Pa) | Duration (min) |
|---|---|---|---|---|---|---|
| 0 | Film-A | None | — | — | — | — |
| 00 | Film-B | None | — | — | — | — |
| 1 | Film-A | Hg Lamp - UV | 400 | N2 | 400 | 1 |
| 2 | Film-A | Hg Lamp - UV | 400 | N2 | 400 | 10 |
| 3 | Film-A | Hg Lamp - UV | 400 | N2 | 400 | 20 |
| 4 | Film-A | Hg Lamp - UV | 400 | N2 | Base | 10 |
| 5 | Film-A | Hg Lamp - UV | 400 | N2 | Base | 20 |
| 6 | Film-A | Thermal Anneal | 400 | N2 | 1 atm | 10 |
| 7 | Film-A | Thermal Anneal | 400 | N2 | 1 atm | 30 |
| 8 | Film-A | Thermal Anneal | 450 | N2 | 1 atm | 10 |
| 9 | Film-A | Thermal Anneal | 450 | N2 | 1 atm | 30 |
| 10 | Film-B | Hg Lamp - UV | 400 | He | 400 | 10 |
| 11 | Film-B | Hg Lamp - UV | 400 | He | 400 | 15 |

The deposition chamber, the UV irradiation chamber, and the thermal annealing chamber were clustered as illustrated in FIG. 4.

The obtained films were analyzed with respect to shrinkage (%) before and after the heat treatment, wet etch resistance (etch rate (nm/min) in solution of 100:1 DHF) of a section of the film deposited on a surface of the substrate without the trenches, and wet etch resistance (etch rate (nm/min) in solution of 100:1 DHF) of a section of the film deposited on a surface of the substrate with the trenches, and step coverage at the trenches was observed. The results are shown in Table 2.

TABLE 2

| Example | Shrinkage (%) | 100:1 DHF WER Blanket (nm/min) | 100:1 DHF WER Pattern (nm/min) | Observation after wet etching |
|---|---|---|---|---|
| 0 | — | 4 | Top/Bottom: 4, Side: >20 | No film on sidewall |
| 00 | — | 8 | Top/Bottom: 8, Side: >20 | No film on sidewall |
| 1 | 1 | 3.8 | Top/Bottom: 4, Side: >20 | No film on sidewall |
| 2 | −2 | 1.5 | Top/Bottom: 1, Side: 1.5 | Good film on sidewall |
| 3 | −3 | 1 | Top/Bottom: <1, Side: <1 | Good film on sidewall |
| 4 | −1 | 1.2 | Top/Bottom: <1, Side: <1 | Good film on sidewall |
| 5 | −1 | 0.8 | Top/Bottom: <1, Side: <1 | Good film on sidewall |
| 6 | 1 | 4 | Top/Bottom: 4, Side: >20 | Poor film on sidewall |
| 7 | 1 | 3 | Top/Bottom: 4, Side: >20 | Poor film on sidewall |
| 8 | 1.5 | 3 | Top/Bottom: 4, Side: >20 | Poor film on sidewall |
| 9 | 1 | 1 | Top/Bottom: 2, Side: 4 | Good film on sidewall |
| 10 | 6 | 2 | Top/Bottom: 2, Side: 4 | Good film on sidewall |
| 11 | 10 | 1 | Top/Bottom: <1, Side: <1 | Good film on sidewall |

As shown in Table 2, when no heat treatment was conducted (Examples 0 and 00), wet etch resistance of the film deposited on the sidewalls of the trenches was significantly lower than that of the film deposited on the top/bottom surfaces of the trenches, indicating that the film properties of the sidewall films and those of the top/bottom films were not homogeneous, and the deposition reaction at the sidewalls was not complete and left significant amounts of impurities. In film A, logically determined impurities were unwanted carbon, chlorine, and excess hydrogen. In film B, logically determined impurities were unwanted carbon and excess hydrogen.

In Example 1, the heat treatment with UV irradiation was conducted for one minute. This degree of the heat treatment is believed to be sufficient to remove unwanted carbon, if any, from the film in view of, e.g., U.S. patent application publication No. 2011/0256734 wherein the SiN film is heated to between about 450° C. and about 500° C., for between about 1 second and about 30 seconds, or between about 1 second and about 20 seconds, or between about 1 second and about 10 seconds, to remove unwanted carbon from the film. However, this degree of heat treatment in Example 1 did not improve homogeneity of film properties, which was not significantly different from that by no heat treatment in Example 0. When the heat treatment with UV irradiation continued for 10 minutes in Example 2, homogeneity of film properties was significantly improved, rendering the film homogeneous. When the heat treatment with UV irradiation continued for 20 minutes in Example 3, homogeneity of film properties was further improved. In Examples 4 and 5, the pressure inside the chamber was not controlled (indicated as "Base") at a constant value, and was changeable according to the flow of gas, as compared with Examples 2 and 3 which controlled the pressure at 400 Pa. As a result, in Examples 4 and 5, the pressure was likely higher than 400 Pa, and brought about slightly improved results as compared with Examples 2 and 3. The above improvements are believed to reside in removing impurities such as halogen and hydrogen from the film at the sidewalls.

The same tendencies as in film A were observed in film B, i.e., Examples 00 (no heat treatment), 10 (heat treatment with UV irradiation for 10 minutes), and 11 (heat treatment with UV irradiation for 15 minutes). Although unwanted carbon was logically included in the films before the heat treatment, unwanted carbon was expected to have been removed as a volatile component when the heat treatment with UV irradiation continued for about one minute. However, the heat treatment with UV irradiation for about one minute was not sufficient to remove excessive hydrogen and halogen. As a result, the film in Example 1 (curing for one minute) was non-homogeneous, the films in Examples 2 and 10 (curing for 10 minutes (at 400 Pa)) improved homogeneity, and the films in Examples 3-5 and 11 (curing for 10 (at base pressure, i.e., without vacuum), 15, and 20 minutes, respectively) significantly improved homogeneity. In order to render the film homogeneous, a certain high degree of thermal energy is required, which exceeds that for removing unwanted carbon, for example.

In Examples 6 to 9, the heat treatment was conducted without UV irradiation (thermal annealing). Thermal annealing at 400° C. for 10 minutes (Example 6), for 30 minutes (Example 7), and at 450° C. for 10 minutes (Example 8) did not significantly improve homogeneity of film properties. When the thermal annealing at 450° C. continued for 30 minutes in Example 9, homogeneity of film properties was significantly improved, rendering the film homogeneous. In order to render the film homogeneous, a certain high degree of thermal energy is required, which exceeds that for removing unwanted carbon, for example.

As shown in Table 2, the wet etch rates of the films (blanket) without the heat treatment (Examples 0 and 00) were almost equal to that of thermal oxide film which is about 3 nm/min as measured as in the examples. Thus, it would not be practical to conduct the heat treatment disclosed herein in view of the properties of the films formed on the top and bottom surfaces of the trenches/holes; however, by the heat treatment disclosed herein, surprisingly, the properties of the films formed on the sidewalls of the trenches/holes can significantly be improved, rendering the film substantially homogeneous.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a conformal, homogeneous dielectric film having at least Si—N or Si—O bonds by cyclic deposition, comprising:

forming a conformal dielectric film in trenches and/or holes of a substrate by cyclic deposition using a gas containing a silicon and a carbon, nitrogen, halogen, hydrogen, and/or oxygen, in the absence of a porogen gas; and heat-treating the conformal dielectric film and continuing the heat-treatment beyond a point where substantially all unwanted carbons are removed from the film and further continuing the heat-treatment to render substantially homogeneous film properties of a portion of the film deposited on side walls of the trenches and/or holes and a portion of the film deposited on top and bottom surfaces of the trenches and/or holes.

2. The method according to claim 1, wherein the heat-treatment exerts thermal energy on the film, which is equivalent to energy which the film receives when the film is placed at about 400° C. for a time period of about 10 minutes or longer with UV irradiation or for a time period of 60 minutes or longer without UV irradiation.

3. The method according to claim 1, wherein the portion of the film deposited on the side walls contains excess impurities as compared with the portion of the film deposited on the top and bottom surfaces, which impurities do not stoichiometrically constitute the film, wherein the heat-treatment is continued to remove excess impurities from the portion of the film deposited on the side walls.

4. The method according to claim 1, wherein the film has Si—N bonds.

5. The method according to claim 1, wherein the film properties include wet etch resistance.

6. The method according to claim 1, wherein the cyclic deposition is thermal atomic layer deposition (ALD), plasma-enhanced ALD, radical-enhanced ALD, or cyclic plasma-enhanced CVD.

7. The method according to claim 1, further comprising, after the heat treatment, cooling the substrate in a non-oxidizing atmosphere before discharging the substrate to an atmospheric condition.

8. The method according to claim 1, wherein before the heat treatment, the conformal dielectric film is non-homogeneous such that the portion of the conformal dielectric film deposited on the side wall has a wet etch rate more than 2.5 times higher than that of the portion of the conformal dielectric film deposited on the top or bottom surface.

9. The method according to claim 1, wherein the heat treatment is conducted in an ambient gas which is at least one selected from the group consisting of a rare gas, nitrogen gas, hydrogen gas, and hydrogen nitride.

10. The method according to claim 1, wherein the heat treatment is conducted in a non-oxidizing atmosphere.

11. The method according to claim 1, wherein the heat treatment is conducted in an inactive ambient gas.

12. The method according to claim 1, wherein the heat treatment is conducted by irradiating the substrate with UV light at a temperature of 400° C. to 600° C.

13. The method according to claim 1, wherein the conformal dielectric film to be subjected to the heat treatment possesses desired film properties in the portion formed on the top and bottom surfaces of the trenches and/or holes.

14. The method according to claim 1, wherein the heat treatment is conducted without vacuum.

* * * * *